(12) United States Patent
Oliver

(10) Patent No.: US 7,589,968 B1
(45) Date of Patent: Sep. 15, 2009

(54) HEAT-DISSIPATING ELECTROMAGNETIC SHIELD

(75) Inventor: Michael J. Oliver, McDonald, PA (US)

(73) Assignee: MAJR Products Corp., Saegertown, PA (US)

( * ) Notice: Subject to any disclaimer, the term of this patent is extended or adjusted under 35 U.S.C. 154(b) by 38 days.

(21) Appl. No.: 11/811,743

(22) Filed: Jun. 11, 2007

(51) Int. Cl.
*H05K 7/20* (2006.01)

(52) U.S. Cl. ............ 361/704; 361/690; 361/695; 361/818; 165/80.3; 165/185

(58) Field of Classification Search ............ None
See application file for complete search history.

(56) References Cited

U.S. PATENT DOCUMENTS

| | | | | |
|---|---|---|---|---|
| 4,546,405 A | * | 10/1985 | Hultmark et al. | 361/718 |
| 5,365,410 A | * | 11/1994 | Lonka | 361/816 |
| 5,566,052 A | * | 10/1996 | Hughes | 361/704 |
| 6,069,794 A | * | 5/2000 | Chuang | 361/697 |
| 6,205,026 B1 | * | 3/2001 | Wong et al. | 361/704 |
| 6,639,800 B1 | * | 10/2003 | Eyman et al. | 361/704 |
| 6,683,796 B2 | * | 1/2004 | Radu et al. | 361/818 |
| 6,963,489 B2 | * | 11/2005 | Askeland et al. | 361/687 |
| 7,061,773 B2 | * | 6/2006 | Chen | 361/816 |
| 7,173,822 B2 | * | 2/2007 | Liang et al. | 361/695 |
| 7,228,887 B2 | * | 6/2007 | Chen et al. | 165/80.3 |
| 7,355,857 B2 | * | 4/2008 | Pirillis et al. | 361/715 |
| 7,362,578 B2 | * | 4/2008 | Hornung | 361/704 |
| 2004/0052064 A1 | * | 3/2004 | Oliver et al. | 361/816 |
| 2007/0147000 A1 | * | 6/2007 | Kuo | 361/704 |

* cited by examiner

*Primary Examiner*—Boris L Chervinsky
(74) *Attorney, Agent, or Firm*—Richard K Thomson

(57) ABSTRACT

A first sheet metal is configured into an enclosure and first and second pluralities of fingers are bent inwardly from the sheet metal to serve retention fingers, the first plurality frictionally engaging the outside of a honeycomb material to retain it in the enclosure while the second plurality serve as a limit stop to keep the honeycomb above the electrical device being protected. The honeycomb may have two sets of oppositely angled honeycomb cells, one capturing airflow from a fan and drawing it into the enclosure which the second set permits convective air currents to rise upwardly out of the enclosure. Alternatively, the cells of the honeycomb may be vertical convective air currents will flow under the wall of the enclosure, with or without the aid of a fan, the vertically directed cells of the honeycomb creating a chimney effect to dissipate the heat.

9 Claims, 3 Drawing Sheets

HEAT-DISSIPATING ELECTROMAGNETIC SHIELD

BACKGROUND AND SUMMARY OF THE INVENTION

The present invention is directed to the field of electronics. More particularly, the present invention is directed to a electromagnetic shield which can also dissipate heat generated by or around an electronic component.

Electronic equipment such as computers, telecommunication equipment, digital amplifiers, TVs, digital/analog circuits, etc., generate large amounts of heat during their operation. In addition, certain critical components are susceptible to and or generate electromagnetic fields and need to be shielded in order to perform properly. It is the object of the present invention to provide a suitable electromagnetic shield which is also capable of dissipating heat. This will obviate the need to provide two separate elements to perform these two critical functions.

The present invention comprises an electromagnetic shield for electronic components, the shield having heat-dissipation capabilities and including a) a fence of a first material forming an enclosure having a plurality of walls, at least some of the walls having retention means; b) a honeycomb member formed of a second material secured within the enclosure; c) means to provide directional airflow through the honeycomb member to dissipate heat from the electronic components. The first material and second materials are galvanically compatible. The retention means comprises a first plurality of fingers formed from the first material bent inwardly toward a center of the enclosure to frictionally engage said honeycomb member. The retention means filrther comprises a second plurality of fingers formed from the first material bent inwardly to serve as limit stops for downward movement of the honeycomb member within the enclosure. In one embodiment, the second material comprises a thermally conductive material. In an alternate embodiment, the second material comprises a thermally non-conductive base material plated/coated with a thermally and electrically conductive material.

In one embodiment, the means to provide directional airflow can be designed for use with an airflow inducing fan and comprises a first portion of the angled cell honeycomb having fins directing airflow towards the bottom of the honeycomb member into the interior of the shielded enclosure and a second portion of opposite angled cell honeycomb directing the heated airflow out of the shielded enclosure toward the top surface of the honeycomb member. The first portion may comprise generally ⅓ of the honeycomb. Alternatively, the means to provide directional airflow includes straight cell honeycomb directing airflow toward the top of the enclosure and a plurality of columns supporting the enclosure with its retained honeycomb above a surface to which it is attached creating a chimney effect which draws cooling air in under a lower edge of the enclosure and discharging the cooling air out the second top surface of the honeycomb member.

Various other features, advantages and characteristics of the present invention will become apparent to one of ordinary skill in the art after a reading of the following specification.

BRIEF DESCRIPTION OF THE DRAWINGS

The preferred embodiment(s) of the present invention is/are described in conjunction with the associated drawings in which like features are indicated with like reference numerals and in which.

DETAILED DESCRIPTION OF PREFERRED EMBODIMENT(S)

Figure 1:
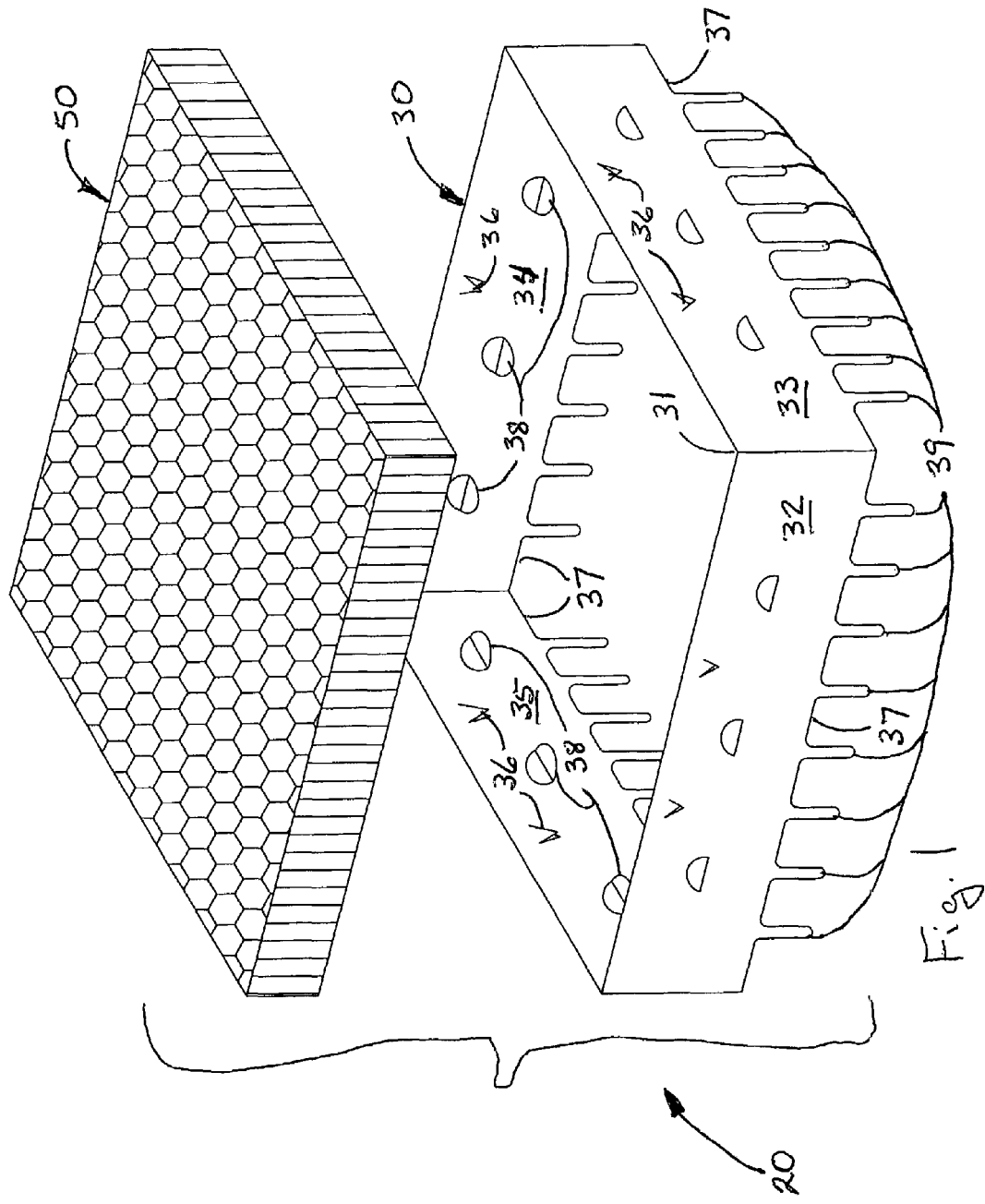
FIG. 1 is an exploded perspective view of a first embodiment of the heat dissipating shield assembly of the present invention.
Figure 2:
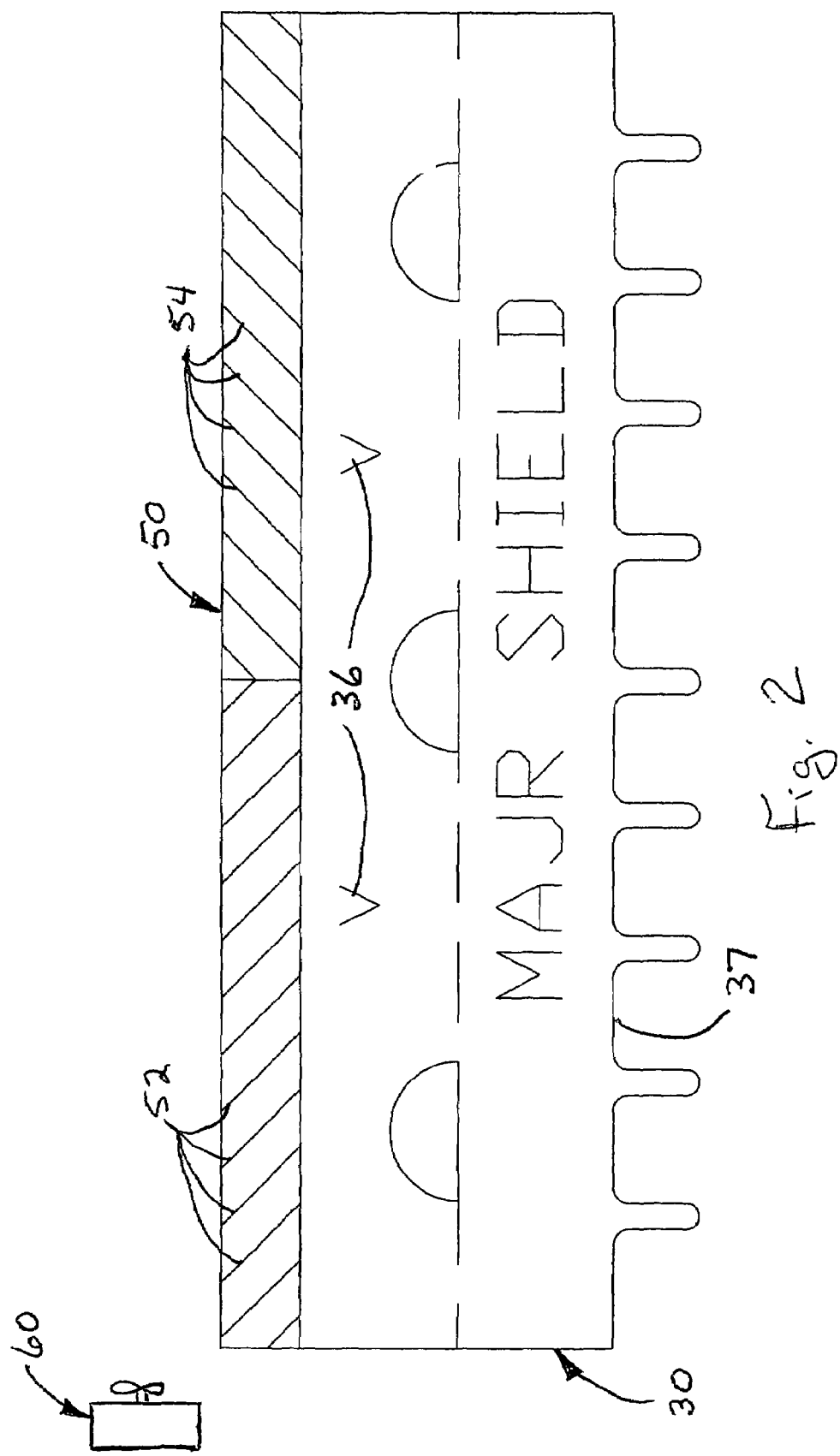
FIG. 2 is a cross-sectional side view of a first embodiment shield.

A first embodiment of the heat-dissipating shield assembly of the present invention is depicted in FIGS. 1 and 2 generally at 20. Shield assembly 20 comprises a fence 30 made of a first metal formed into an enclosure 31 with a plurality (four shown) of walls 32, 33, 34, 35, at least some of which have retention means 36, 38 formed thereon. Enclosure 31 will typically be built around the periphery of a piece of electronic equipment (not shown) which produces heat. Retention means 36 preferably comprises a first plurality of tangs or spring fingers pushed into the enclosure from each of the metallic walls 32-35. Retention means further comprises a second set of fingers 38 bent inwardly from walls 32-35 which serve as rests or limit stops for the honeycomb member 50. Fence 30 has a plurality of columns 39 which can be received in slots in a support matrix (not shown) to restrain heat-dissipating shield assembly from movement. Columns 39 are of sufficient length to hold the bottom edge 37 of walls 32-35 a distance above the surface of the matrix.

Honeycomb member 50 in the FIG. 2 embodiment comprises angled honeycomb cells 52 which direct airflow from fan 60 into enclosure 31 and a plurality of opposite angle honeycomb cells 54 angled upwardly in the opposite direction to permit convective heat currents to rise away from the enclosure 31 drawing heat from the electronic equipment housed therein. While honeycomb cells, are shown equally divided between inwardly directed 52 and outwardly directed 54, more preferably, the inwardly directed cells 52 will comprise generally about ⅓ of the surface to enable the outbound convective air currents more chance to flow. It is envisioned that the honeycomb 50 may be constructed of a metal which is galvanically compatible with the metal used to construct fence 30 or, alternatively, honeycomb 50 may be constructed of a non-conductive material, such as plastic and be plated/coated with a thermally and electrically conductive material. When the honeycomb 50 is pressed downwardly into enclosure 31 which has been dimensioned to receive it, second plurality of fingers 38 serve as limit stops holding the honeycomb 50 above the electrical device with which shield assembly 20 is used. First plurality of fingers 36, being downwardly directed, will prevent upward movement of honeycomb 50 out of enclosure 31. The shield assembly 20 will protect the enclosed electrical device from electromagnetic fields emanating from other nearby electrical devices and/or retain emissions from the enclosed electrical device so as not to interfere with other nearby electrical devices, in addition to removing heat therefrom.

Figure 3:
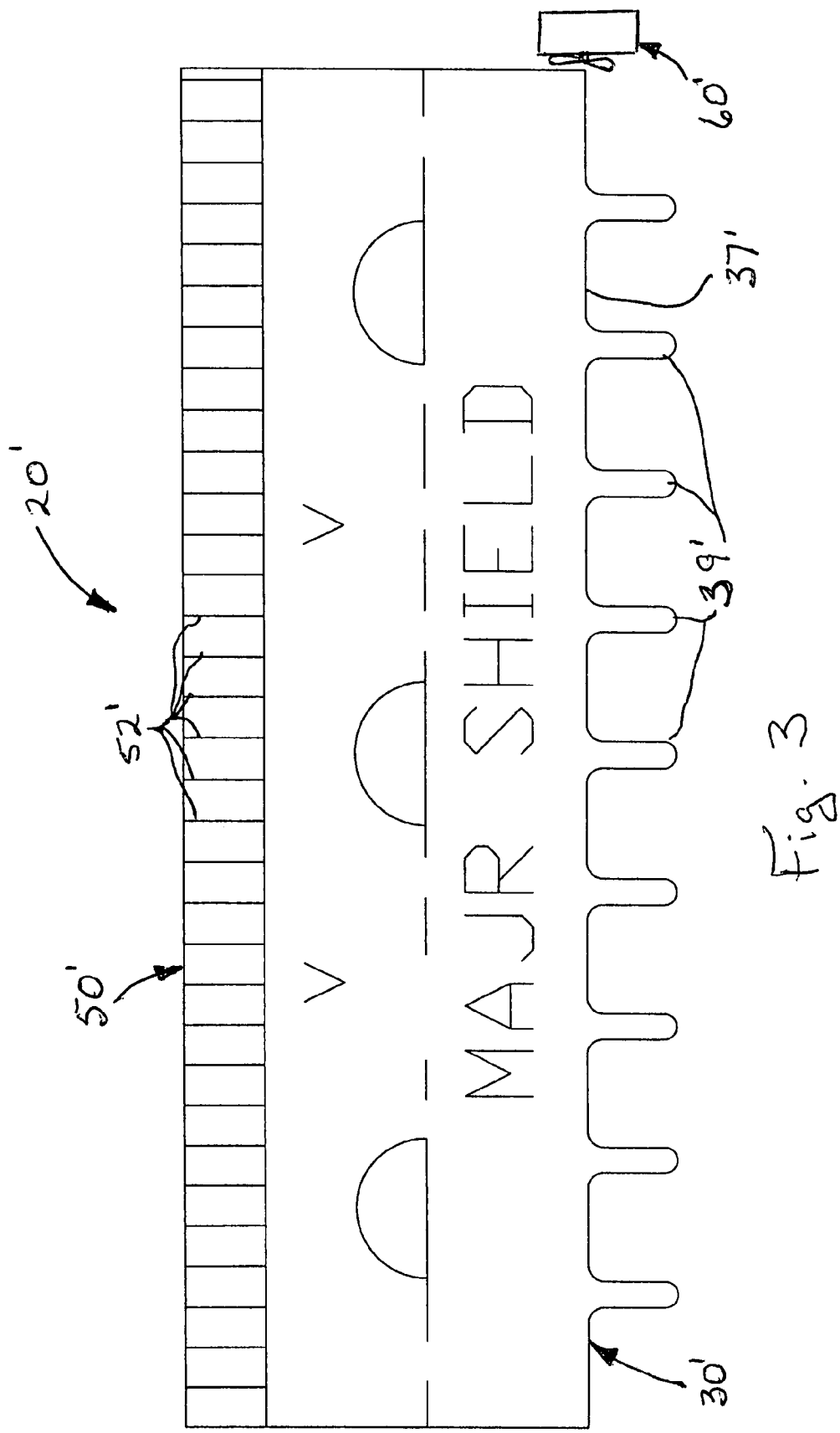
FIG. 3 is a cross-sectional side view of a second embodiment of the shield.

A second embodiment of the present invention is shown in FIG. 3 generally at 20'. In this embodiment, honeycomb 50' has vertically directed honeycomb cells 52' and fan 60' directs airflow toward the lower edge 37' of fence 30'. Columns 39' are partially inserted into the support matrix forming stand-offs which permit convective currents to flow under lower edge 37' such that fan 60' becomes optional. The air flows under fence 30' where the vertically directed fins 52' create a chimney effect causing the heat to rise away from the enclosed electrical device. The heat-dissipating electromagnetic shield of the present invention can be purchased from MAJR Products Corporation, Sagertown, Pa. under the tradename "MAJR Shield".

Various changes, alternatives and modifications will become apparent to one of ordinary skill in the art following a reading of the foregoing specification. It is intended that any such changes, alternatives and modifications as fall within the scope of the appended claims be considered part of the present invention.

I claim:

1. An electromagnetic shield for electronic components, said shield having heat-dissipation capabilities and comprising
   a) a fence of a first material forming an enclosure having a plurality of walls, at least some of said walls having retention means, said retention means including
      i) engagement means extending about an interior of said plurality of walls toward a center of said enclosure to frictionally engage a supported member, and,
      ii) a first plurality of fingers formed from said first material bent inwardly from a vertically mid-portion of said walls to serve as limit stops for downward movement of said supported member within said enclosure;
   b) said supported member comprising a honeycomb member formed of a second material secured within said enclosure;
   c) means to provide directional airflow through said honeycomb member to dissipate heat from the electronic components, said means to provide directional airflow is designed for use with an airflow-inducing fan and comprises a first portion of said honeycomb having a first portion of angled honeycomb cells directing airflow towards a first bottom of said honeycomb member and a second portion of opposite angled honeycomb cells directing airflow toward a second top surface of said honeycomb member.

2. The electromagnetic shield of claim 1 wherein said first material and said second material are galvanically compatible.

3. The electromagnetic shield of claim 1 wherein said engagement means comprises a second plurality of fingers formed from said first material bent inwardly toward a center of said enclosure to frictionally engage said honeycomb member.

4. The electromagnetic shield of claim 1 wherein said second material comprises a thermally and electrically conductive material.

5. The electromagnetic shield of claim 1 wherein said second material comprises a thermally non-conductive material plated/coated with a thermally and electrically conductive material.

6. The electromagnetic shield of claim 1 wherein said first portion comprises generally ⅓ of said honeycomb.

7. An electromagnetic shield for electronic components, said shield having heat-dissipation capabilities and comprising
   a) a fence of a first material forming an enclosure having a plurality of walls, at least some of said walls having retention means said retention means including
      i) engagement means extending about an interior of said plurality of walls toward a center of said enclosure to frictionally engage a supported member, and,
      ii) a first plurality of fingers formed from said first material bent inwardly from a vertically mid-portion of said walls to serve as limit stops for downward movement of said supported member within said enclosure;
   b) said supported member comprising a honeycomb member formed of a second material secured within said enclosure;
   c) means to provide directional airflow through said honeycomb member to dissipate heat from the electronic components wherein said means to provide directional airflow comprises straight honeycomb cells directing airflow toward a top of said enclosure and a plurality of columns adapted to support said enclosure with its retained honeycomb above a surface to which it is attached creating a chimney effect drawing cooling air in under a lower edge of said enclosure and discharging the cooling air out said second top surface of said honeycomb member.

8. Apparatus for removing heat from an electronic device, said apparatus comprising:
   a) a cooling fan oriented to create air movement past the electronic device at a distance spaced therefrom defining a flow path;
   b) an electromagnetic shield positioned to be in said flow path, said electromagnetic shield including
      i) a fence of a first material forming an enclosure having a plurality of walls, at least some of said walls having retention means;
      ii) a honeycomb member formed of a second material secured within said enclosure;
      iii) means to direct airflow from said cooling fan through said honeycomb member to dissipate heat from the electronic components wherein said means to direct said airflow through said honeycomb includes a first portion of said honeycomb having angled honeycomb cells directing airflow towards a first bottom of said honeycomb member and a second portion of opposite angled honeycomb cells directing airflow toward a second top surface of said honeycomb member.

9. The apparatus of claim 8 wherein said means to direct said airflow through said honeycomb comprises straight honeycomb cells directing airflow toward a top of said enclosure and a plurality of columns supporting said enclosure with its retained honeycomb above a surface to which it is attached creating a chimney effect drawing cooling air in under a lower edge of said enclosure and discharging the cooling air out said second top surface of said honeycomb member.

* * * * *